United States Patent [19]

Gercekci et al.

[11] 4,367,558
[45] Jan. 4, 1983

[54] METHOD FOR AUTOMATICALLY SEARCHING FOR AN RF STATION

[75] Inventors: Anil Gercekci, Geneva, Switzerland; Heinz B. Maeder, Täby, Sweden

[73] Assignee: Motorola, Inc., Schaumburg, Ill.

[21] Appl. No.: 218,872

[22] Filed: Dec. 22, 1980

[51] Int. Cl.³ .......................... H03J 7/28; H03L 7/18; H04B 1/26

[52] U.S. Cl. ................................... 455/164; 455/165; 455/182; 455/183; 455/260

[58] Field of Search ............... 455/164, 165, 182, 185, 455/186, 183, 260, 265

[56] References Cited

U.S. PATENT DOCUMENTS 3,936,753  2/1976  Clark .................................... 455/164
4,280,140  7/1981  Skerlos ................................ 455/182

*Primary Examiner*—Marc E. Bookbinder
*Attorney, Agent, or Firm*—Joe E. Barbee

[57] ABSTRACT

A method of automatically searching for an RF carrier uses a synthesized frequency. The synthesized frequency is generated by a voltage controlled oscillator which is part of a phase locked loop. The phase locked loop has a programmable divider which is controlled by a phase locked loop controller. The phase locked loop controller receives inputs from a frequency discriminator which is a portion of an RF receiver which is receiving the RF signals. The search is accomplished by using a frequency sweep rather than searching for a carrier at allocated frequency positions. When the search is initiated, large frequency steps are taken until a carrier signal is passed up and then the steps are decreased in size and inversed until the carrier signal is encountered again.

2 Claims, 4 Drawing Figures

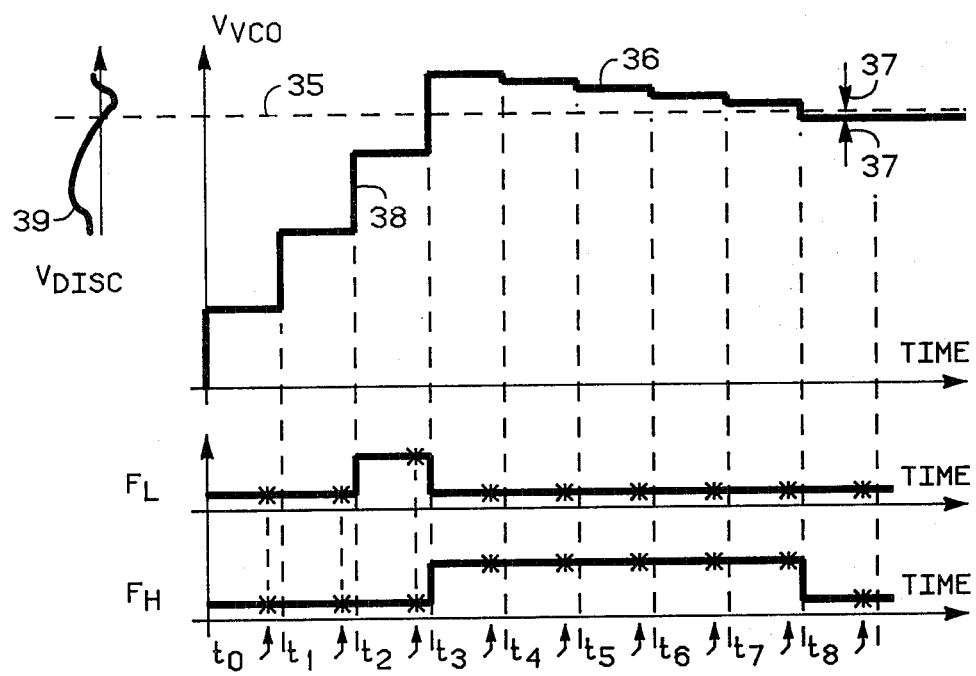
FIG 3
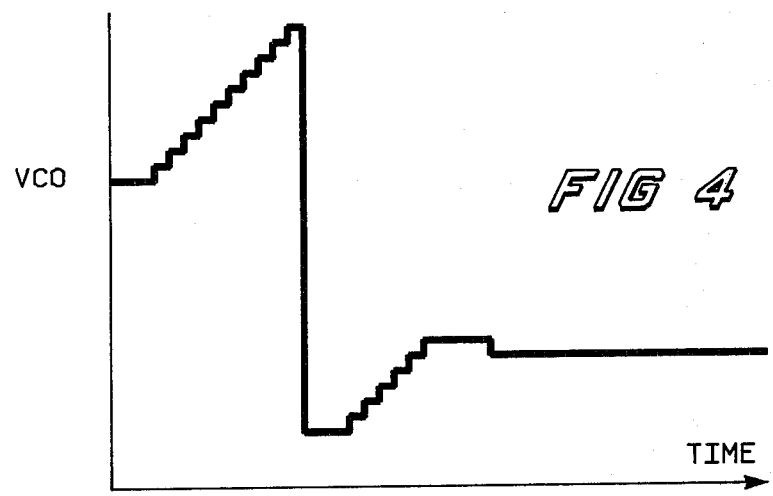
FIG 4
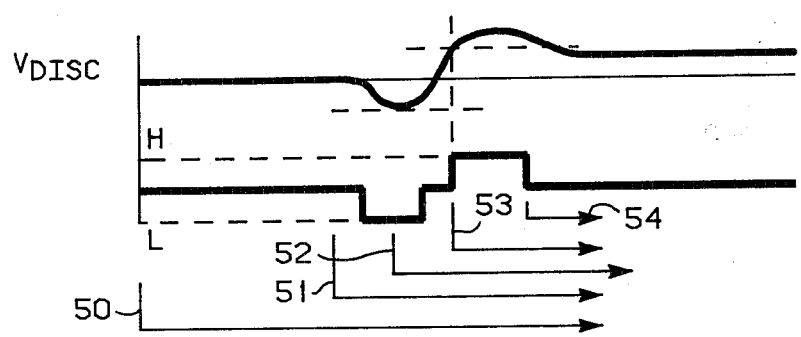

METHOD FOR AUTOMATICALLY SEARCHING FOR AN RF STATION

This invention relates, in general, to automatic station searching systems and, more particularly, to a method for automatically searching for a radio frequency (RF) station with a frequency synthesizer system.

Automatic station searching systems have been used in the past. In general, these systems were used to find a predetermined frequency which the system was pre-programmed to locate. Such systems were widely used in television receivers to locate desired television channels. Prior to these systems, some automobile radios could scan across the radio broadcast band and stop on stations within the sensitivity level of the automobiles' radio receiver. These systems were, in general, electro-mechanical systems.

Accordingly, it is an object of the present invention to provide an improved method of searching for an RF station.

Another object of the present invention is to provide a method for automatically searching for a station using a frequency synthesizer system.

Yet another object of the present invention is to provide a method for automatically searching for a station by making a frequency sweep rather than searching for a carrier at allocated channel positions.

SUMMARY OF THE INVENTION

The above and other objects and advantages of the present invention are carried out in one form thereof, by providing a method for searching for an RF station by making a frequency sweep. In carrying out the present method, a synthesized frequency is generated by a phase locked loop. The phase locked loop contains a voltage controlled oscillator which is stepped in predetermined frequency steps. A frequency discriminator generates a signal when the desired station being searched for is passed up. The voltage controlled oscillator is then decremented in frequency steps smaller than the predetermined frequency step until the carrier frequency is once again met or passed up. At this point the searching stops since the desired station is now within the final quantization offset of the system.

BRIEF DESCRIPTION OF THE DRAWINGS

FIG. 3 illustrates in graphical form the stepping sequence followed in carrying out the present invention; and FIG. 4 illustrates in graphical form yet another operational sequence in carrying out the present invention.

The exemplifications set out heren illustrate the preferred embodiments of the invention in one form thereof, and such exemplifications are not intended to be construed as limiting in any manner.

DETAILED DESCRIPTION OF THE DRAWINGS

Figure 1:
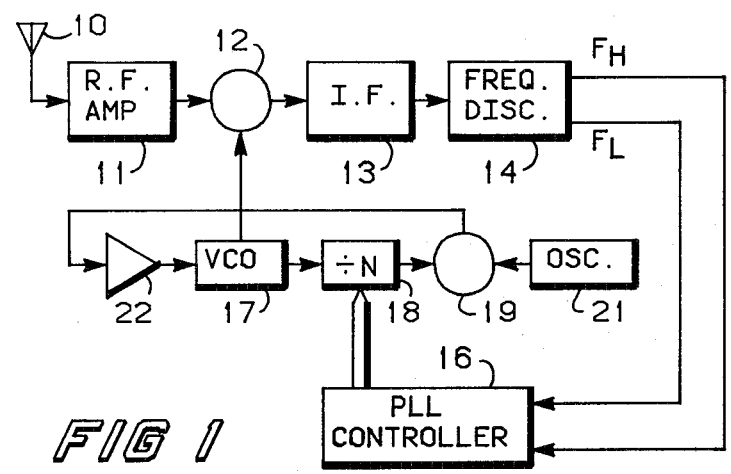
FIG. 1 illustrates in block diagram form a portion of an RF receiver capable of practicing the present invention.

FIG. 1 illustrates in block diagram form a portion of a radio frequency (RF) receiver. Antenna 10 which is coupled to an RF amplifier 11 picks up the RF signal. Amplifier 11 amplifies the RF signal and sends this signal to receiver-mixer 12 where it is mixed with an output frequency from voltage controlled oscillator 17. The output of receiver-mixer 12 is coupled to an intermediate frequency (IF) stage 13 which serves to amplify and selectively filter the output of mixer 12. The output of IF stage 13 is connected to a frequency discriminator 14. Frequency discriminator 14 provides two outputs $F_H$ and $F_L$ which are represented in digital form in the receiver system. The outputs of frequency discriminator 14 are coupled to a phase locked loop controller 16 which, in a preferred embodiment, includes a microcomputer. Controller 16 provides an output to a variable divider 18. Divider 18 receives an output from voltage controlled oscillator 17 and divides the voltage controlled oscillator output down. The output of programmable divider 18 is connected to a frequency and phase detector 19. An oscillator 21 also provides an input to detector 19. Oscillator 21 typically includes a reference oscillator which is a stable crystal oscillator whose buffered output is fed to a reference divider. The reference divider divides down the output frequency of the stable crystal oscillator to provide a reference frequency which is connected to detector 19. The output of frequency and phase detector 19 is connected to a loop filter 22. In a preferred embodiment, filter 22 is an integrating amplifier filter which provides sufficient gain to drive voltage controlled oscillator 17.

The output of voltage controlled oscillator 17 can be made to vary in response to an output from controller 16 which changes the output of programmable divider 18. As the output of divider 18 changes, detector 19 will provide a modified output to filter 22 which drives voltage controlled oscillator 17 causing a new frequency output to mixer 12. This in turn causes mixer 12 to provide a modified output which is amplified and filtered by IF stage 13 and coupled to frequency discriminator 14 causing frequency discriminator 14 to provide modified $F_H$ and $F_L$ output signals. In summary, voltage controlled oscillator 17 provides a synthesized frequency which is controlled by modifying the loop dividing ratio (N) which is provided by divider 18. When the phase locked loop has settled to the lock situation, the voltage controlled oscillator output will equal the output of oscillator 21 times divide ratio N. The main requirement of the RF receiver needed to carry out the present invention is that the RF receiver must increment in discrete frequency steps across the desired frequency band.

Figure 2:
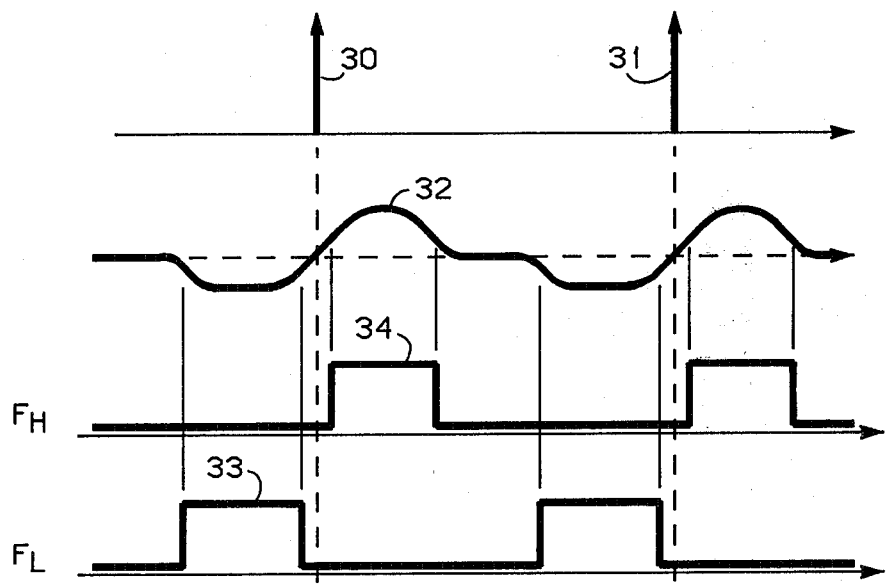
FIG. 2 shows in graphical form some of the signals associated with the frequency discriminator of FIG. 1.

FIG. 2 illustrates in graphical form a signal spectrum in increasing frequency from left to right having a carrier 30 and adjacent carrier 31. Waveform 32 is shown lined-up frequency-wise with carriers 30 and 31. Waveform 32 is an analog signal which is generated internal to frequency discriminator 14 (FIG. 1). Waveforms $F_H$ and $F_L$ represent the outputs of frequency discriminator 14. Waveform 32 represents voltage amplitudes about a zero point. When waveform 32 is below the zero point, output $F_L$ is generated, and when waveform 32 is above the zero point, output $F_H$ is generated as indicated by portion 34. It should be noted that portions 33 and 34 are not generated until waveform 32 has exceeded the zero point by a predetermined amount. Note how the frequency discriminator will generate an output $F_L$ when the carrier frequency is being approached and the generates an output $F_H$ once the carrier frequency is passed.

FIG. 3 illustrates how the control voltage to the voltage controlled oscillator varies when a carrier frequency 35 is found. As carrier frequency 35 is approached an analog signal 39 is generated internal to frequency discriminator 14 (FIG. 1). Before carrier 35 is approached, the voltage controlled oscillator is varied in large steps 38. Once carrier 35 is passed up, then the voltage controlled oscillator is varied or decremented in small steps 36. Small steps 36 are continued until carrier 35 is met or once again passed up. Once carrier 35 is encountered a second time, the search is stopped. If the voltage controlled oscillator happens to be slightly below carrier 35, then there will be a small offset which is a final quantization offset of the system. This final quantization offset of the system is indicated by arrows 37.

In FIG. 3, time is shown increasing from left to right. As will be noted, as soon as carrier 35 is approached, the frequency discriminator generates an output signal $F_L$ and once carrier 35 is passed up, the frequency discriminator generates an output $F_H$. The marks indicated by $t_0$ through $t_8$ are the discriminator output sample times.

FIG. 4 illustrates in graphical form a slight variation of the operation of the frequency discriminator. The top waveform illustrates the stepping of the voltage controlled oscillator, whereas the center waveform is once again the analog signal generated by the frequency discriminator and the lower waveform is the frequency discriminator's digital output. Time increases from left to right. Arrow 50 indicates the initiation of a search. Arrow 51 indicates the top of the frequency band being searched. In this first example or search sweep, no carrier was encountered as indicated by the filtered discriminator voltage waveform. At arrow 52 the search continues after a slight pause. At arrow 53, fine tuning is initiated, and at arrow 54 fine tuning is complete, indicating that a station has been found.

By now, it should be appreciated that a method of automatically searching for a station is accomplished by a sweep rather than searching for a carrier frequency at an allocated channel position. A frequency discriminator is used to detect the proximity of a carrier and a phase locked loop controller is used to modify the loop dividing ratio. This in turn established a new synthesized frequency from a voltage controlled oscillator. Once the phase locked loop has been allowed to settle, the phase locked loop controller analyzes the output of the frequency discriminator and compares it with the previous samples of the frequency discriminator output. If the expected transitions of the frequency discriminator do not occur, the synthesizer frequency is continued to be modified in regular increments. In order to achieve a sufficiently fast search time over the full frequency range, the frequency steps made may not be the minimum that the phase locked loop can achieve, but a multiple thereof. However, these steps have to be less than either of the frequency sensitivity ranges of the frequency discriminator. Due to this coarse quantification of the frequency scan, it is seldom possible to stop the search exactly on the optimum point. Generally the system overshoots the optimum point as the search proceeds in discrete frequency steps and, in doing so, the desired sequence at the output of the frequency discriminator is used as a stop criteria which is detected by the phase locked loop controller. When this overshoot is detected, the frequency stepping direction is reversed and the phase locked loop controller steps back the synthesized frequency. However, this procedure is executed this time with the minimum frequency steps that the phase locked loop can achieve in order to minimize the final quantification offset with respect to the ideal stop position, which is coincident with the position in the frequency domain of the signal carrier.

We claim:
1. A method of performing an automatic station search for a carrier with a receiver having a controllable phase locked loop, comprising:
   establishing a synthesized frequency in the phase locked loop;
   monitoring an output from a frequency discriminator and modifying the synthesized frequency in predetermined steps based on an output from the frequency discriminator wherein the synthesized frequency is modified in smaller steps after the carrier is passed up and further including continuing modifying the synthesized frequency in the smaller steps toward the carrier until the carrier frequency is once again encountered, and, thereafter, stopping the search.
2. A method of performing a search for a carrier frequency using a receiver having a phase locked loop, comprising: stepping a voltage controlled oscillator located within the phase locked loop in predetermined frequency steps; detecting when the carrier frequency is passed up; decrementing the voltage controlled oscillator in frequency steps smaller than the predetermined frequency steps until the carrier frequency is once again encountered; and stopping the stepping of the voltage controlled oscillator.

* * * * *